United States Patent
Ritter et al.

(10) Patent No.: US 9,578,783 B2
(45) Date of Patent: Feb. 21, 2017

(54) MINIATURE MULTILAYER RADIATIVE COOLING CASE WTIH HIDDEN QUICK RELEASE SNAPS

(75) Inventors: Darin Bradley Ritter, Indianapolis, IN (US); Mickey Jay Hunt, Camby, IN (US); Mark William Gysin, Noblesville, IN (US)

(73) Assignee: Thomson Licensing, Issy les Moulineaux ( * ) Notice: Subject to any disclaimer, the term of this patent is extended or adjusted under 35 U.S.C. 154(b) by 636 days.

(21) Appl. No.: 13/580,482

(22) PCT Filed: Feb. 22, 2011

(86) PCT No.: PCT/US2011/000319
§ 371 (c)(1),
(2), (4) Date: Aug. 22, 2012

(87) PCT Pub. No.: WO2011/106082
PCT Pub. Date: Sep. 1, 2011

(65) Prior Publication Data
US 2012/0307455 A1 Dec. 6, 2012

Related U.S. Application Data

(60) Provisional application No. 61/338,907, filed on Feb. 25, 2010.

(51) Int. Cl.
*H05K 5/00* (2006.01)
*H05K 7/00* (2006.01)
(Continued)

(52) U.S. Cl.
CPC ..... *H05K 7/20445* (2013.01); *H01L 23/4006* (2013.01); *G06F 1/1656* (2013.01);
(Continued)

(58) Field of Classification Search
CPC ......... H01L 2924/0002; H01L 2924/00; H01L 23/4006; H01L 2023/405; H01L 2924/181;
(Continued)

(56) References Cited

U.S. PATENT DOCUMENTS 4,771,910 A * 9/1988 Roy ........................ E05C 19/06
220/4.02
4,887,147 A 12/1989 Friedman
(Continued)

FOREIGN PATENT DOCUMENTS

| CN | 1814339 A | 8/2006 |
|---|---|---|
| CN | 1826046 | 8/2006 |

(Continued)

OTHER PUBLICATIONS

Kihara; Infrared Sheds Light on New Uses for Remote Units; Aug. 1, 1990; Jee Journal of Electronic Engineering, Dempa Publications Inc., Tokyo, JP; vol. 27, No. 284, pp. 58-60.
(Continued)

*Primary Examiner* — Adam B Dravininkas
(74) *Attorney, Agent, or Firm* — Brian J. Dorini; Jerome G. Schaefer

(57) ABSTRACT

A passive cooling arrangement for an electronic housing assembly is provided. The assembly includes a frame disposed in the housing assembly; a circuit board supported in the frame; a heat generating component disposed on the circuit board; and a heat sink configured with a substantially flat peripheral portion and a depression portion. The substantially flat peripheral portion faces and is nearly coextensive with an outer wall of said housing assembly, and the depression portion is in thermal engagement with the heat generating component on the circuit board. The frame includes a base having embosses which support the circuit
(Continued)

board in a position enabling thermal engagement of the heat generating component and the depression portion of the heat sink. The outer wall of the housing assembly is preferably unvented and the housing assembly is preferably oriented in use with the outer wall facing upwardly.

11 Claims, 9 Drawing Sheets

(51) Int. Cl.
| | | |
|---|---|---|
| H05K 7/20 | (2006.01) | |
| H05K 13/00 | (2006.01) | |
| G06F 1/16 | (2006.01) | |
| H01L 23/40 | (2006.01) | |

(52) U.S. Cl.
CPC .. *H01L 2924/0002* (2013.01); *H05K 7/20436* (2013.01); *H05K 13/00* (2013.01)

(58) Field of Classification Search
CPC ............... H05K 7/20436; H05K 13/00; H05K 2201/10386; H05K 5/0217; H05K 5/0221; H05K 5/00; Y10T 29/49826; Y10T 29/49002; Y10T 29/49169; Y10T 29/4913; Y10T 29/49126; G06F 1/1656; G06F 1/1626; G06F 1/1637; G06F 1/181; G06F 1/1679
USPC .............. 361/679.39, 679.4, 679.46, 679.54, 361/679.58, 714, 711
See application file for complete search history.

(56) References Cited

U.S. PATENT DOCUMENTS

| | | | |
|---|---|---|---|
| 5,091,618 A | | 2/1992 | Takahashi |
| 5,402,309 A | * | 3/1995 | Ohgami et al. .......... 361/679.37 |
| 5,620,242 A | | 4/1997 | Leon et al. |
| 5,667,397 A | | 9/1997 | Broschard et al. |
| 5,669,522 A | * | 9/1997 | Million ................ H05K 5/0013 177/181 |
| 5,691,878 A | | 11/1997 | Ahn et al. |
| 5,743,606 A | * | 4/1998 | Scholder ................ F16B 12/26 220/786 |
| 5,917,236 A | | 6/1999 | Leader, III et al. |
| 6,021,044 A | | 2/2000 | Neville, Jr. et al. |
| 6,025,991 A | | 2/2000 | Saito |
| 6,049,469 A | | 4/2000 | Hood, III et al. |
| 6,212,074 B1 | | 4/2001 | Gonsalves et al. |
| 6,223,815 B1 | | 5/2001 | Shibasaki |
| 6,301,096 B1 | * | 10/2001 | Wozniczka ........... F21V 23/026 174/548 |
| 6,317,325 B1 | | 11/2001 | Patel et al. |
| 6,382,995 B1 | | 5/2002 | Bricaud et al. |
| 6,411,507 B1 | | 6/2002 | Akram |
| 6,454,607 B2 | | 9/2002 | Bricaud |
| 6,524,361 B1 | | 2/2003 | Thornton et al. |
| 6,567,360 B1 | | 5/2003 | Kagawa |
| 6,593,673 B1 | | 7/2003 | Sugai et al. |
| 6,655,590 B1 | | 12/2003 | McFeely et al. |
| 6,672,514 B1 | | 1/2004 | Brennan et al. |
| 6,735,085 B2 | | 5/2004 | McHugh et al. |
| 6,881,077 B2 | * | 4/2005 | Throum ................ H05K 5/0052 174/16.3 |
| 7,050,305 B2 | | 5/2006 | Thorum |
| 7,158,380 B2 | | 1/2007 | Green et al. |
| 7,187,553 B2 | * | 3/2007 | Schmidberger ............... 361/719 |
| 7,203,065 B1 | | 4/2007 | Sin Yan Too |
| 7,215,551 B2 | | 5/2007 | Wang |
| 7,265,984 B2 | | 9/2007 | Numata |
| 7,350,705 B1 | | 4/2008 | Frederick et al. |
| 7,362,578 B2 | | 4/2008 | Hornung |
| 7,450,387 B2 | | 11/2008 | Cheng et al. |
| 7,518,875 B2 | | 4/2009 | Desrosiers et al. |
| 7,519,627 B2 | | 4/2009 | Malloy |
| 7,791,874 B2 | | 9/2010 | Reents et al. |
| 7,839,630 B2 | | 11/2010 | Hwang et al. |
| D631,449 S | | 1/2011 | Ritter et al. |
| 7,961,471 B2 | | 6/2011 | Odanaka et al. |
| 8,009,426 B2 | | 8/2011 | Ahmad-Taylor et al. |
| 8,278,880 B2 | | 10/2012 | Nakajima et al. |
| 8,620,162 B2 | | 12/2013 | Mittleman |
| 8,701,279 B2 | | 4/2014 | Filson et al. |
| 8,766,093 B2 | | 7/2014 | Lee |
| 8,773,858 B2 | | 7/2014 | Burns |
| 8,902,588 B2 | | 12/2014 | Ritter et al. |
| 9,007,773 B2 | | 4/2015 | Warren et al. |
| 2001/0026441 A1 | | 10/2001 | Nakamura |
| 2002/0039286 A1 | * | 4/2002 | Frank et al. ................... 361/818 |
| 2002/0051338 A1 | | 5/2002 | Jiang et al. |
| 2002/0154487 A1 | * | 10/2002 | Weischhoff Van Rijn ... 361/719 |
| 2002/0186536 A1 | | 12/2002 | Kimball et al. |
| 2002/0193136 A1 | * | 12/2002 | Halkosaari ............... H04M 1/18 455/550.1 |
| 2003/0178627 A1 | | 9/2003 | Marchl et al. |
| 2005/0111195 A1 | | 5/2005 | Wu |
| 2005/0128710 A1 | | 6/2005 | Beiteimal et al. |
| 2005/0248923 A1 | | 11/2005 | Hsu |
| 2006/0067054 A1 | | 3/2006 | Wang et al. |
| 2006/0148295 A1 | | 7/2006 | Reents et al. |
| 2006/0181859 A1 | * | 8/2006 | Thorum ............... H05K 5/0052 361/719 |
| 2006/0187643 A1 | | 8/2006 | Tsurufusa |
| 2006/0187645 A1 | * | 8/2006 | Numata ............... H05K 7/2049 361/704 |
| 2006/0215357 A1 | | 9/2006 | Green et al. |
| 2007/0053513 A1 | | 3/2007 | Hoffberg |
| 2007/0058336 A1 | * | 3/2007 | Cheng ........................... 361/687 |
| 2007/0177356 A1 | | 8/2007 | Panek |
| 2007/0294777 A1 | | 12/2007 | Kobayashi |
| 2008/0280482 A1 | | 11/2008 | Huang |
| 2009/0148638 A1 | | 6/2009 | Kishi et al. |
| 2010/0073881 A1 | | 3/2010 | Williams |
| 2010/0097768 A1 | | 4/2010 | Ishii et al. |
| 2011/0205710 A1 | | 8/2011 | Kondo et al. |
| 2012/0140417 A1 | | 6/2012 | Puertolas et al. |
| 2012/0243166 A1 | | 9/2012 | Burton et al. |
| 2012/0243176 A1 | * | 9/2012 | Ritter et al. .................. 361/692 |
| 2013/0063895 A1 | | 3/2013 | Ritter et al. |
| 2013/0347051 A1 | | 12/2013 | Bose et al. |

FOREIGN PATENT DOCUMENTS

| | | |
|---|---|---|
| CN | 1917755 | 2/2007 |
| CN | 100548040 | 10/2009 |
| CN | 201352820 Y | 11/2009 |
| CN | 201515429 U | 6/2010 |
| CN | 0N201571126 | 9/2010 |
| CN | 102714928 A | 10/2012 |
| DE | 202005013758 | 1/2006 |
| EP | 0399763 B1 | 3/1997 |
| EP | 1248507 A1 | 10/2002 |
| EP | 1511314 A1 | 3/2005 |
| EP | 1610600 | 12/2005 |
| FR | 2871022 | 12/2005 |
| FR | 2875917 A1 | 3/2006 |
| GB | 2355017 A | 4/2001 |
| GB | 2436170 | 9/2007 |
| JP | 129349 | 8/1986 |
| JP | 6-227553 | 8/1994 |
| JP | 07-059124 | 3/1995 |
| JP | H07-86471 | 3/1995 |
| JP | 10-4281 | 1/1998 |
| JP | 199865385 | 3/1998 |
| JP | 10154390 | 6/1998 |
| JP | 11233982 | 8/1999 |
| JP | 2000-269671 | 9/2000 |
| JP | 2000-269675 A | 9/2000 |
| JP | 2001-147061 A | 5/2001 |
| JP | 2001284748 | 10/2001 |
| JP | 2001-358482 A | 12/2001 |
| JP | 2002-134970 A | 5/2002 |

(56) References Cited

FOREIGN PATENT DOCUMENTS

| | | |
|---|---|---|
| JP | 2002-324989 A | 11/2002 |
| JP | 2003-017143 A | 1/2003 |
| JP | 2004186294 | 7/2004 |
| JP | 2004363525 | 12/2004 |
| JP | 2005-005424 | 1/2005 |
| JP | 2005-078642 | 3/2005 |
| JP | 2007208123 | 8/2007 |
| JP | 2008034474 | 2/2008 |
| JP | 2008-131512 | 6/2008 |
| JP | 2009-141160 A | 6/2009 |
| JP | 2001053480 | 2/2010 |
| KR | 20060045266 | 5/2006 |
| TW | 200943036 | 10/2009 |
| WO | WO2007/089321 A2 | 8/2007 |
| WO | WO2007/109216 A1 | 9/2007 |
| WO | WO2009057124 | 5/2009 |
| WO | WO2010/118971 A1 | 10/2010 |
| WO | WO2011/071516 A1 | 6/2011 |
| WO | WO2011071516 | 6/2011 |
| WO | WO2011/106082 A1 | 9/2011 |
| WO | WO2011106082 | 9/2011 |
| WO | WO2011/146302 A1 | 11/2011 |
| WO | WO2011146302 | 11/2011 |
| WO | WO 2011146302 | 11/2011 |

OTHER PUBLICATIONS

McDermott; Remote-Control Transmitter/Receiver Chips Exhibit Enhanced Capabilities, Mar. 1, 1982, E.D.N. Electrical Design News, vol. 27, No. 5, pp. 71-74.

* cited by examiner

MINIATURE MULTILAYER RADIATIVE COOLING CASE WTIH HIDDEN QUICK RELEASE SNAPS

This application claims the benefit, under 35 U.S.C. §365 of International Application PCT/US2011/000,319, filed 22 Feb. 2011, which was published in accordance with PCT Article 21(2) on 1 Sep. 2011, in English and which claims the benefit of U.S. Provisional Application Ser. No. 61/338,907 filed 25 Feb. 2010.

CROSS-REFERENCE TO RELATED APPLICATIONS

This application claims priority from U.S. Provisional Application Ser. No. 61/338,907 filed Feb. 25, 2010, which is incorporated by reference herein in its entirety.

FIELD OF THE INVENTION

The present invention relates to quiet set-top boxes having improved heat dissipating capabilities.

BACKGROUND OF THE INVENTION

Set-top boxes continue to be in high demand and an ever increasing need exists to reduce the size and improve aesthetic appeal, performance, and robustness of these devices and the like.

Particular problems that set-top boxes face are damage due to liquid entry, insect entry, and heat generation. However, venting apertures, which are often used for heat dissipation, unfortunately increase the opportunity of liquid and insect entry. As such, a need exists to address each of these problems without creating or augmenting other problems.

An additional consideration in designing set-top boxes to keep in mind is the consumer preference for smaller set-top boxes that are quiet, attractive, and mechanically and electrically robust that fit in crowded or small entertainment centers. Because heat dissipation fans, which tend to improve electrical robustness of the set-top boxes, introduce noise and increase size of set-top boxes, a need exists for a design which can be robust without fans and yet meet consumer preferences.

SUMMARY OF THE INVENTION

A set top box is disclosed which comprises: a top heat sink component having a planar peripheral portion surrounding a central depression portion; a circuit board under the top heat sink component, the circuit board having a heat generating component thermally contacting the central depression portion; a frame having a base and embosses, the base being under the circuit board and the embosses contacting and supporting the circuit board; and an outer cover housing an internal assembly which comprises the top heat sink component, circuit board, and frame therein. The outer cover has an upper wall, a lower wall, two outer side walls, a front side and an open end, wherein the open end is configured to enable the internal assembly to be inserted into the outer cover. The frame has two parallel side walls and a back wall, the side walls being parallel to the two outer side walls of the outer cover and the back wall being positioned at the open end of the outer cover, wherein a gap can exist between an entire edge of the planar periphery portion and the side walls and the back wall. An upper gap can also exist between the upper wall of the outer cover and the planar periphery of the top broad heat sink component and a bottom gap can exist between the lower wall of the outer cover and the base of the frame. Alternatively, the planar periphery portion can have a thermal joint between a border of the planar periphery portion and the side walls and the back wall, the base can have apertures, and the set top box can have a plurality of feet attached to an exterior side of the lower wall, wherein the feet are at least 6 mm in height.

At least one of the parallel side walls can have a slot and the outer cover has a clip snap adjacent to at least one of the outer side walls, wherein the clip snap is engaged in the slot and locks the internal assembly in the outer cover. The clip snap can be adjacent to the open end and the clip snap preferably has a flexible member directed away from the open end and forming an acute angle with the at least one outer side wall and the clip snap also preferably has a distal end that engages the clip snap in the slot. The clip snap can have a top portion and bottom portion engaged with an edge region of the upper wall and the lower wall, respectively, thereby securing the clip snap within the outer cover. Additionally, the back wall can have an opening aligned with the flexible member and adapted to received a release rod such that the insertion of the release rod causes the distal end to disengage from the slot, thereby permitting the internal assembly to be removed.

BRIEF DESCRIPTION OF THE DRAWINGS

The invention will now be described by way of example with reference to the accompanying figures of which.

DETAILED DESCRIPTION OF THE EMBODIMENTS

Figure 1A:
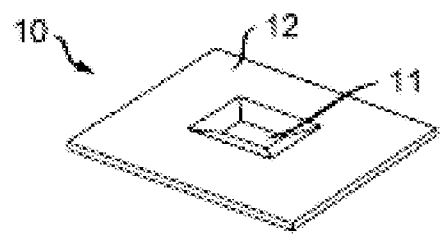
FIG. 1 shows a series of views of the major components of the set-top box according to the invention.

The set-top box 1 or the like according to the invention includes the various components which are shown in FIG. 1 and includes a top broad heat sink 10, a main printed circuit board 13, a frame pan 18, and an outer cover 28.

More particularly, FIG. 1A shows a top broad heat sink 10, which is an internal component. The top broad heat sink 10 can be a generally contoured plate that has a generally planar periphery 12 and a contoured central feature such as a pocket, central depression, notch, recess, multilevel depression, mesa extending from and/or into a plane of the planar periphery. The central feature or central depression 11 can have side walls extending from the planar periphery and form an obtuse angle therewith. The contoured feature can have a flat bottom designed to contact the main integrated circuit and/or other heat generating component 17.

Figure 1B:
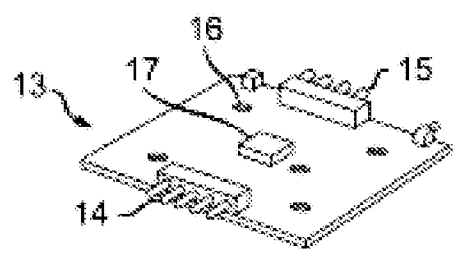

FIG. 1B shows a main printed circuit board 13 or the like, which can be generally flat. The main printed circuit board 13 can have a main integrated circuit 17 or the like in a central region and holes 16 for mounting and/or securing the main printed circuit board 13 to a frame pan 18. Other features of the main printed circuit board are shown in the figure which can include jack panel connectors 15 at one edge and a button cluster 14 at another edge, which can be an opposing edge. The main integrated circuit and other heat generating or hot components 17 can contact the flat bottom or other portion of the central depression 11 of the top broad heat sink 10, which can be in thermal contact with the other heat generating or hot components through a thermal joint 27 which could be a pad.

Figure 1C:
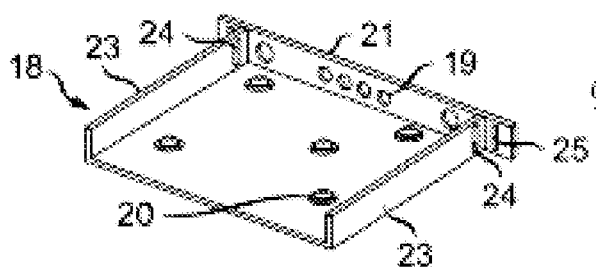

FIG. 1C shows a frame pan 18 which can have a rectangular shape and four sides and which can house the main printed circuit board (pc board) 13. The frame pan 18 has a back wall 21 with jack panel apertures 19 to accommodate jack panel connectors 15 or the like and a base wall or base 22 having embosses 20 for the mounting or securing of the pc board 13 through the holes 16 therein. Additionally, the frame pan can have on the back wall 21 at least one opening 25 therethrough which can be through a portion of the back wall that extends beyond the side walls 23 of the frame pan 18. Additionally, the side walls 23 can have slots 24 therethrough closer to the end of the side walls that are adjacent to the back wall 21. The slots 24 are used to lock the frame pan 18 in the outer cover 28.

Figure 1D:
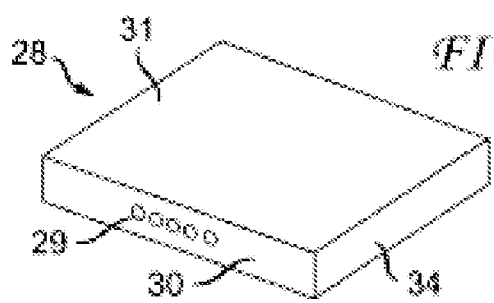
Figure 1E:
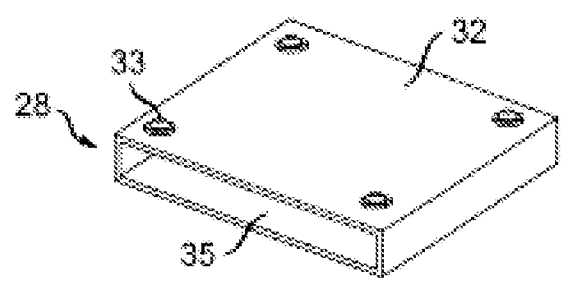

FIGS. 1D and 1E show an outer cover 28 of the set top box 1 in an upright position and a rotated upside down position, respectively. The orifices 29 are shown in the front side 30 which can be decorative. The orifices 29 are designed and aligned to accommodate the button cluster 14. The outer cover 28 further includes an upper wall 31, lower wall 32, two outer sides 34, and an open back 35. The exterior side of the lower wall 32 can include rubber feet 33 which can be at least 6 mm in height to ensure adequate air entry under the set top box for improved thermal management. The assembled internal components of FIGS. 1A-1C are inserted into the outer cover 28 via the open back 35.

Figure 2:
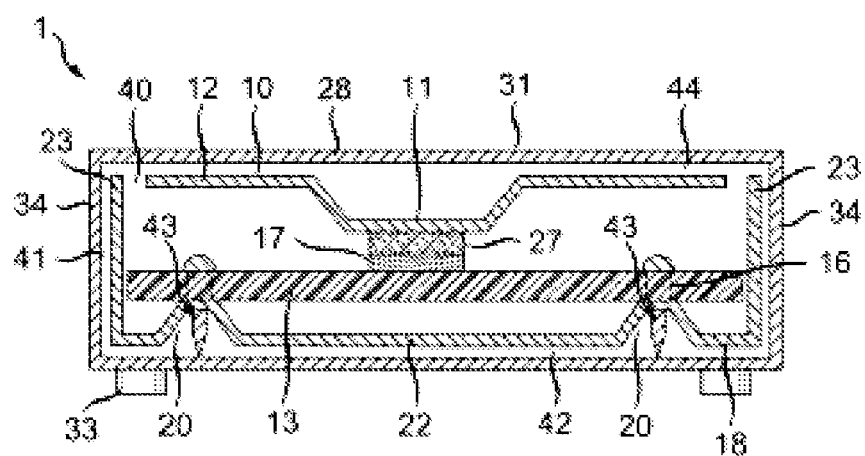
FIG. 2 shows an interior view of the assembled set-top box according to the invention with a front portion of the set top box removed.

FIG. 2 shows a simplified internal view of the set top box 1 in an assembled form with a front portion of the set top box removed. The top broad heat sink 10 having the generally planar periphery 12 and the central depression 11 is shown being in thermal contact with the main pc board 13. The broad heat sink can extend to cover the top edges of the walls of the frame pan. More specifically, the central depression 11 can thermally contact the main integrated circuit board or other heat generating component 17 on the pc board 13 through a thermal pad joint or contact 27. The main printed circuit board 13 is shown being mounted and/or secured to embosses 20 of the frame pan 18 by use of screws, bolts or solder pad joints 43 through the holes 16 or contact points in the circuit board 13, wherein the main printed circuit board 13 is effectively thermally contacting the frame pan 18.

The construction shown in FIG. 2 generally shows how the heat generated by the components on the pc board 13 is transferred into the top broad heat sink 12 and the frame pan 18 through embosses 20. The heat spreads out in the pan 18 and then radiates to the inside surface of the outer cover 28. The outer cover 28 then radiates and convects the heat to the ambient air with no vents or minimal use of vents.

FIG. 2 further shows outer gaps 41 between the side walls 23 of the frame pan 18 and the outer side 34 of the outer cover 28; inner gaps 40 between the edge of the planar periphery 12 of the top broad heat sink 12 and the side walls 23 of the frame pan 18; bottom gap 42 between the lower wall 32 of the outer cover 28 and the base 22 of the frame pan 18; and upper gap 44 between the upper wall 31 of the outer cover 28 and the planar periphery 12 of the top broad heat sink 10. The bottom gap 42 and upper gap 44 prevent the outer cover 28 from overheating.

Figure 3:
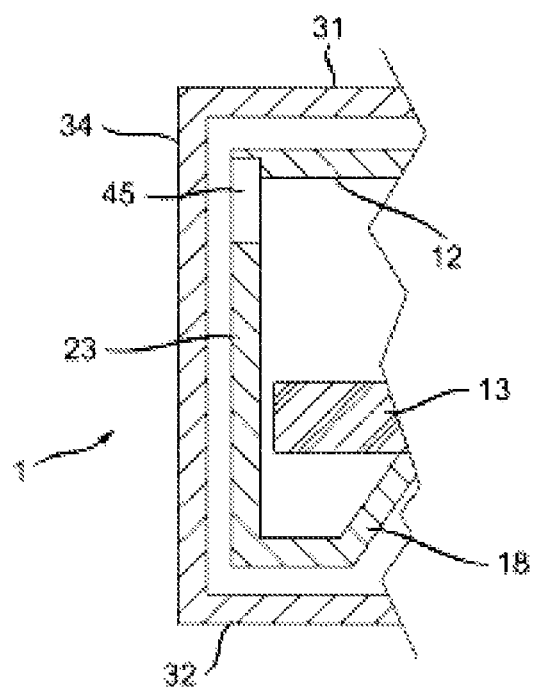
FIG. 3 shows a cross-sectional view of an alternative design of the set top box according to the invention.

FIG. 3 shows a cross-sectional view of an alternative design of the set top box 1 in which the side wall 23 of frame pan 18 thermally contacts the planar periphery 12 of the top broad heat sink 10 through a thermal joint 45.

Figure 4:
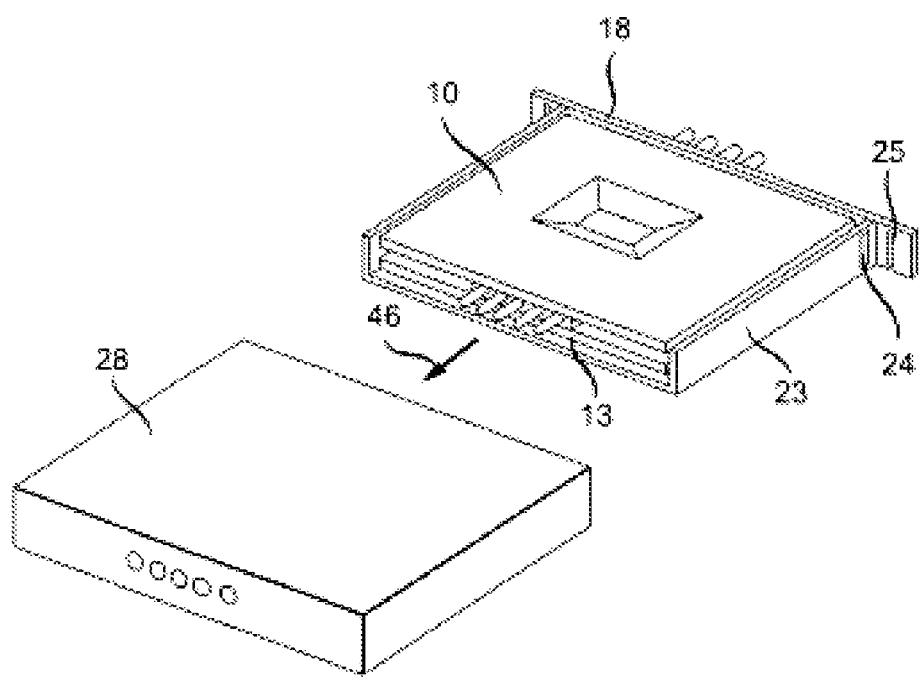
FIG. 4 shows the insertion of the inner assembly into a 5-sided outer cover of the set top box.

FIG. 4 is a perspective view of the set top box 1 showing the insertion of the inner assembly into a 5-sided outer cover 28 of the set top box. The inner assembly comprises the pc board 13 with the top broad heat sink 12 thereon contained within the frame pan 18. The arrow in FIG. 4 shows the insertion direction 46 of the inner assembly into the outer cover 28.

Figure 5A:
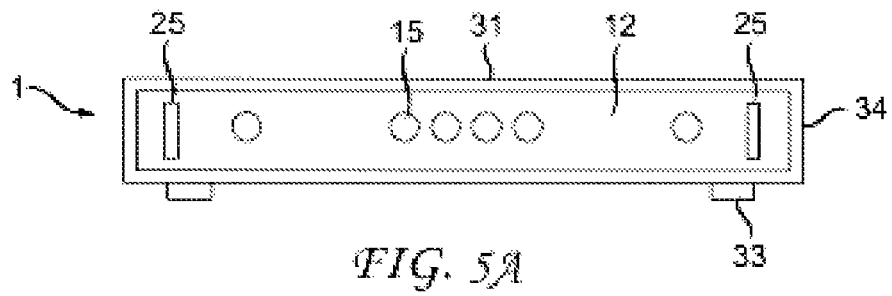
FIG. 5 shows the rear view of the set top box and a top view of the set top box for the application of a cover removal fixture to disassemble the set-top box according to the invention.
Figure 5B:
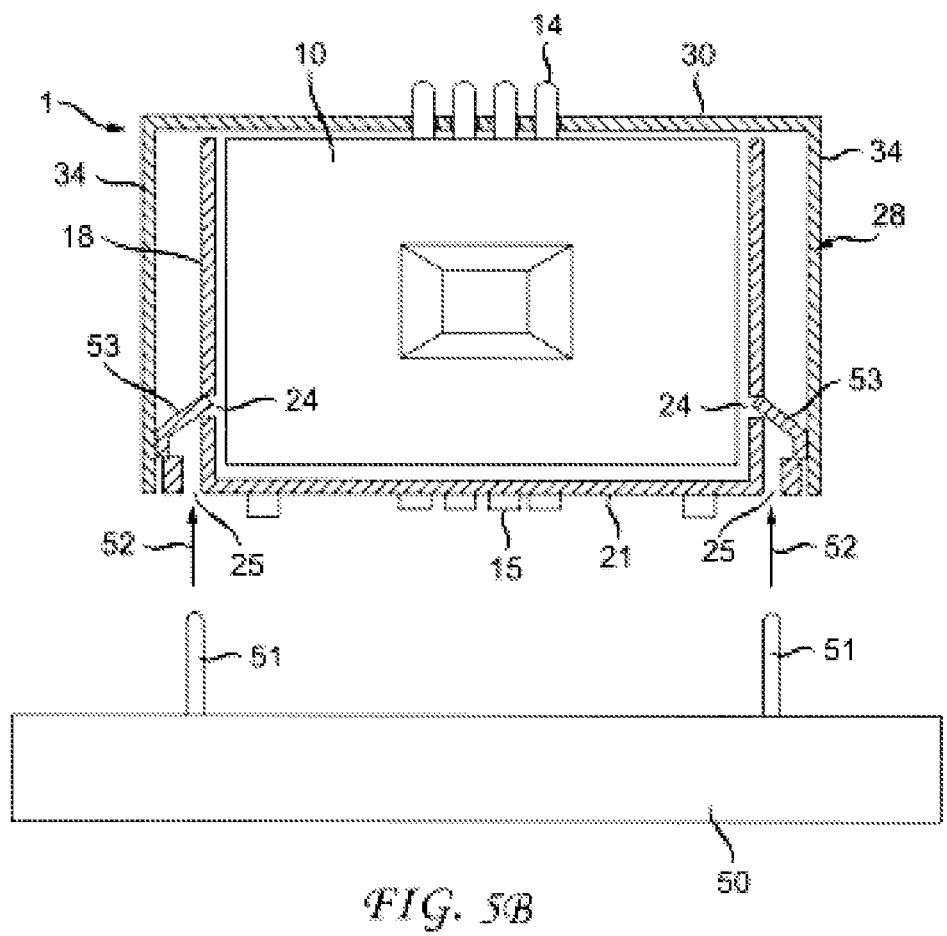

FIGS. 5A and 5B show additional features that can be employed in the set top box according to the invention. FIG. 5A is a rear view of the set top box 1 showing the back wall 21 of the pan frame 18 and FIG. 5B shows how a cover removal fixture 50 is applied to the back wall 21 to disassemble the set-top box 30 for maintenance, diagnostics, or electronic component upgrading. In particular, FIGS. 5A and 5B show a possible layout for the back wall 21 in which two openings 25 are configured to permit two protruding release fingers 51 of the cover removal fixture 50 to enter therethrough. In cases where insect entry is a concern the set top box can be completely sealed from insect entry when no vents are used and the two openings 25 are covered with removable caps which are not shown in the figures.

FIG. 5B shows a top view of the set top box 1 with the upper wall 31 of the outer cover removed and, in particular, shows an additional feature of the outer cover 28 which is that the outer cover can have a clip snap 53 extending from the interior of the outer sides 34 or the outer cover 28 that applies an inwardly force away from the outer walls 34. The clip snaps 53 do not necessary need to be attached to the out walls, but can be attached to the lower wall 32 or the upper wall 31. Anyway, the clip snaps 53 align with the slots 24, which can be alternatively be grooves, of the frame pan 18 such that the inwardly force causes the clip snaps 53 to engage the slots 24 when the frame pan 18 is slid into the outer cover 28, thereby locking frame pan 18 into the out cover 28. The clip snaps 53 have a flexible member directed away from the open back wall 35 and forms an acute angle with the outer sides 34. The clip snaps 53 have a distal end that engage slots 24.

To disassemble the set top box 1, a forward force 52 is applied to two clip snaps 53 by the release fingers 51 as the release fingers 51 are inserted into the openings 25. The forward force 52 causes the release fingers 51 to flex outwardly, thereby removing the distal ends of the clip snaps 53 from the slots 24. Once the clip snaps are removed from the slots 24 with the release fingers 51 applied, the outer cover 28 can easily slide forward, thereby facilitating the removal of the pan frame 18 along with the internal components therein.

Figure 6:
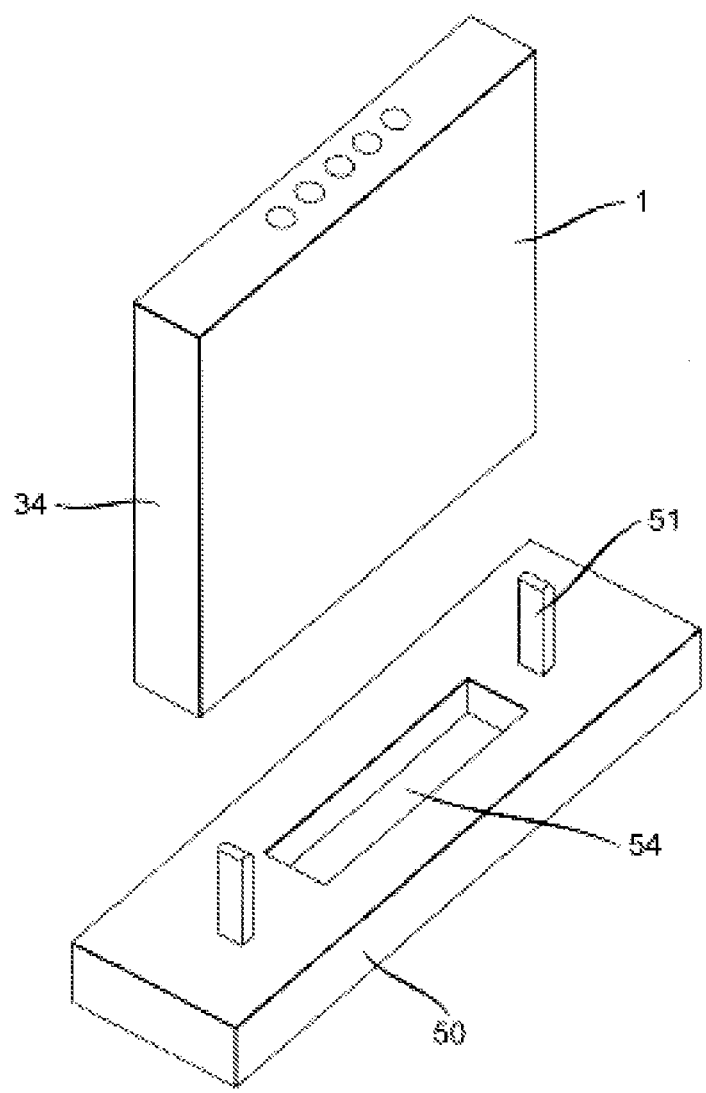
FIG. 6 is a perspective view of the set top box and cover removal fixture for the disassembly of the set top box according to the invention.

FIG. 6 is a perspective view of the set top box 1 and cover removal fixture 50 for the disassembly of the set top box 1. This feature of the set top box 1 requiring the cover removal fixture 50 to disassemble the set-top box 1 helps to ensure that the set top box 1 will only be disassembled by a qualified technician in possession of the cover removal fixture 50. This perspective view of the cover removal fixture 50 shows clearance 54 in the base of the cover removal fixture 50 to accommodate the jack panel connectors 15 such that the release fingers 51 can be fully inserted into the openings 25 to cause the clip snaps 53 to sufficiently flex.

Figure 7:
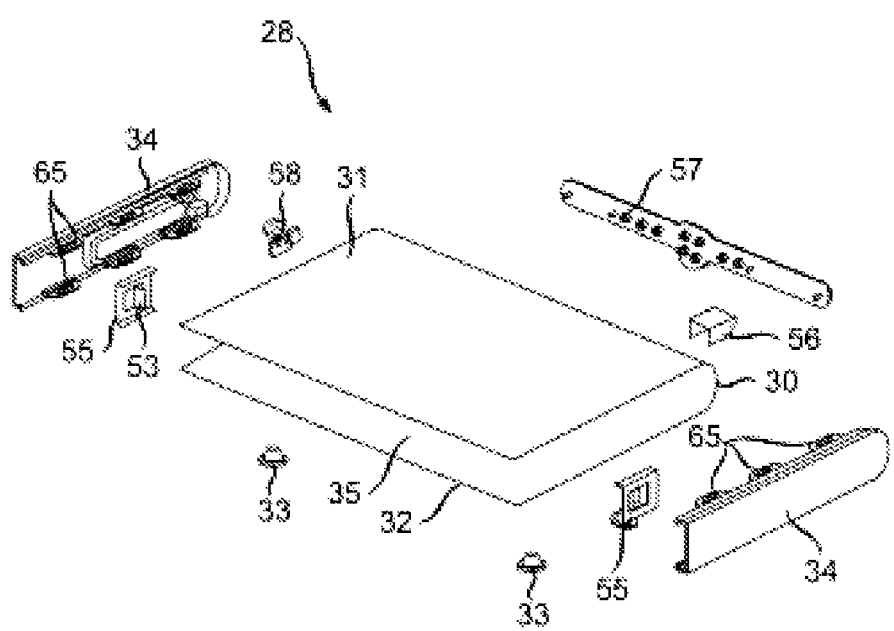
FIG. 7 shows an outer cover of the set top box according to the invention.

FIG. 7 shows an embodiment of the invention in which the outer cover 28 of the set top box 1 is constructed by having the two outer sides 34 snapped onto the left and right sides of a folded structure that comprises the upper wall 31, the lower wall 32, and the front side 30. The front side 30 optionally has a C-shape that is connected to the parallel upper 31 and lower walls 32. The outer sides 34 can snap into receiving portions 66 (not shown) on the upper and lower walls 31, 32 through holding assemblies 65 on the upper and lower portions of the outer sides 35. FIG. 7 further shows clip snap assemblies 55 which attach to the inner sides of the outer walls 34 or alternatively attach to the outer edges of the upper wall 31 and lower wall 32 such that they are adjacent to the outer walls 34. The clip snaps assemblies can provide the clip snaps 53, which can be used to hold in the frame pan 18 in final assembly when the frame pan 18 is inserted in the open back 35. FIG. 7 further shows a heat stake logo LED shield 56 and a heat stake bezel 57 which can both attach to the outer surface of the front side 30. Also, shown is a button assembly 58 which also attaches to the inner sides of at least one outer wall 34.

Figure 8:
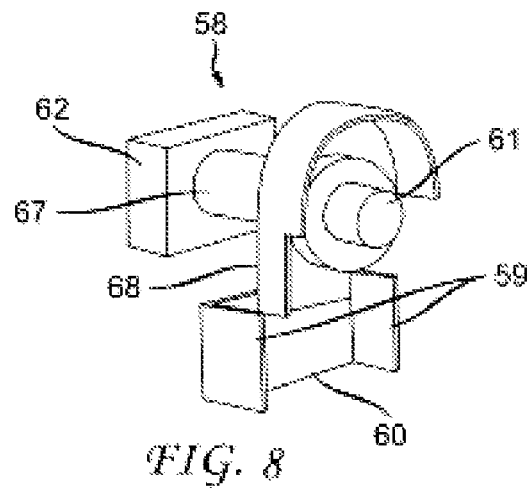
FIG. 8 shows a button assembly that provides a stop to position the frame pan within the outer cover according to the invention.
Figure 9:
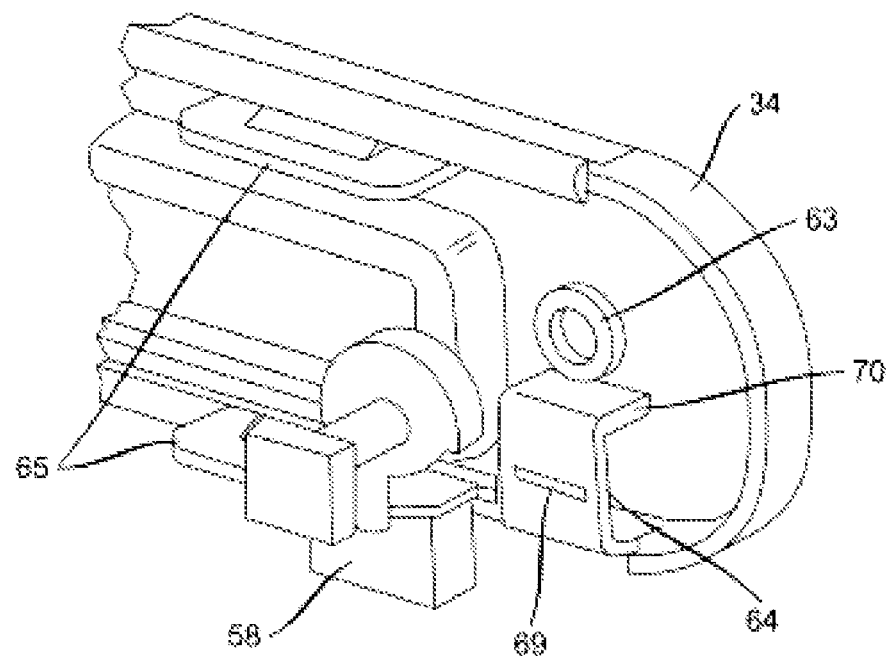
FIG. 9 shows the attachment of the button assembly 58 to the outer wall of the outer cover according to the invention.

FIG. 8 shows a detailed view of the button assembly 58 and FIG. 9 shows how the button assembly 58 attaches to the outer wall 34. The button assembly 58 has a central button 61 at one end of a rod or central member 67 and a stop 62 which can have a rectangular shape. Extending perpendicularly from the rod or central member 67 is an attachment member 68, which has two opposing elastic grasping members 59 and a locator rib 60.

FIG. 9 further shows how the button assembly 58 attaches to the outer wall 34 by having the button 61 being placed in button receiving hole 63 of the outer wall and simultaneously having the two opposing elastic grasping members 59 snap around the edges of a rib assembly 64 on the outer wall 34. The rib assembly 64 can have a plate structure that is parallel to the outer wall 34 and spaced therefrom by an attachment spacer 70. The locator rib 60 of the button assembly 58 slides under a rib 69 of the rib assembly 64 such that button assembly 58 is held into place by having the locator rib 60 and rib 69 in contact while the button 61 is engaged in the hole 63 and by having the two opposing elastic grasping members 59 snapped into place. The stop 62 can then be used to ensure that the frame pan 18 is properly held within the outer cover 28.

Figure 10A:
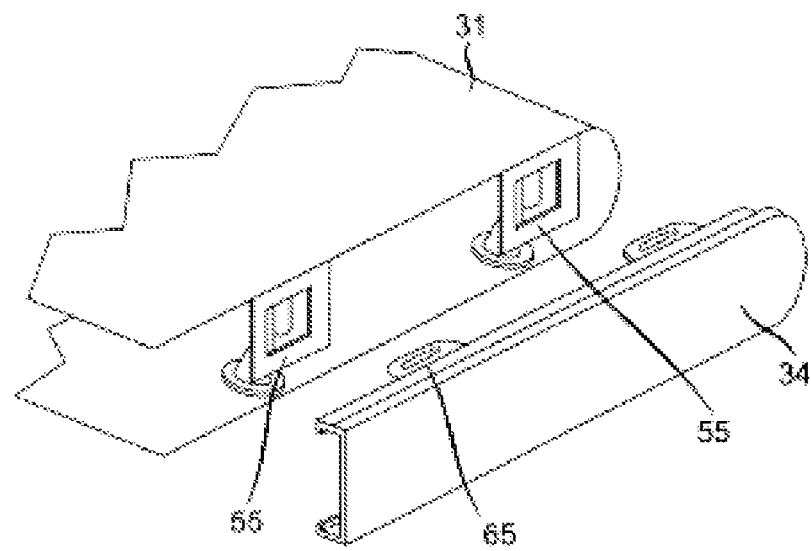
FIG. 10 shows the attachment of clip snap assemblies at the outer sides of the outer cover according to the invention.
Figure 10B:
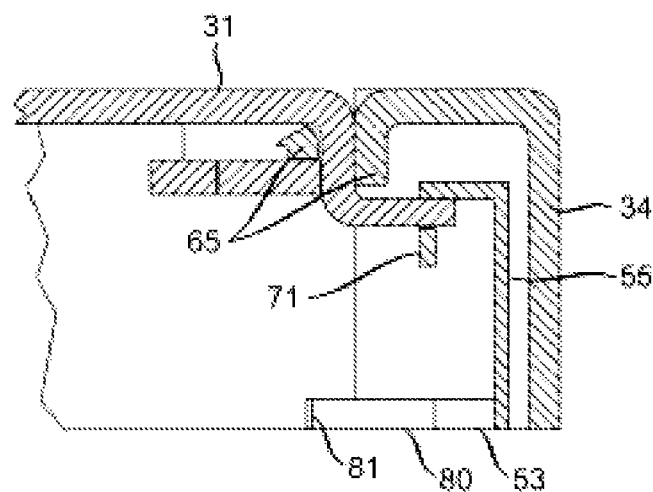

FIG. 10 shows how the clip snap assemblies 55 can attach to the outer edges of the upper wall 31 and lower wall and how the outer sides 34 snap onto the sides of a folded structure. FIG. 10A shows a perspective view of the attachment and FIG. 10B shows a cross sectional view of the attachment of the clip snap assemblies 55 and the outer sides 34. More particularly, FIG. 10B shows the clip snap assembly 55 having hook 71 at its end that hooks through an aperture in the edge of the upper wall 31. Likewise the clip snap assembly 55 can have another hook 71 at the bottom of the clip snap that hooks through an aperture in the edge of the lower wall 32, thereby securing the clip snap assembly 55.

FIG. 10B further shows the holding assembly 65 of the outer wall 34 extending perpendicularly from the inner wall of the outer wall 34 and has an aperture therethrough to permit an edge portion of the upper wall 31 to hook therein. Likewise a similar holding assembly 65 of the outer wall 34 can be present at the bottom of the outer wall and can engage an edge portion of the lower wall 32, thereby securing the outer wall to the folded structure to form the outer cover 28. There can be multiple clip snap assemblies on either side of the set top box. The clip snap can have a flexible central member (80) that directed away from the open back (35) and forming an acute angle with the outer side (34) and the clip snap 53 also has a distal end (81) that engages the slot (24).

Figure 11A:
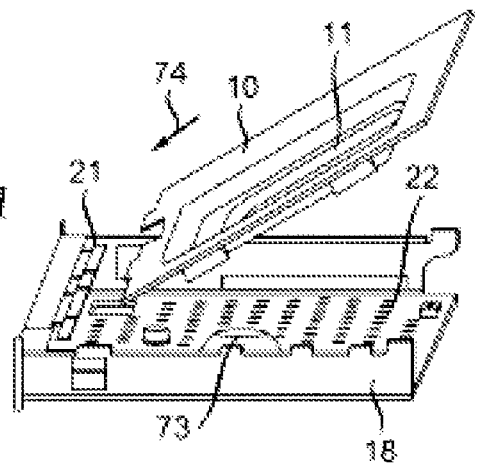
FIG. 11 shows the joining of the top broad heat sink 10 to the frame pan before insertion into the outer cover according to the invention.
Figure 11B:
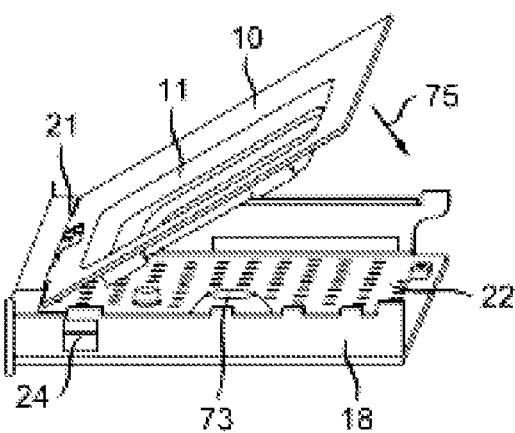

FIG. 11 generally shows how top broad heat sink 10 can be joined to the frame pan 18 before insertion into the outer cover 28. FIG. 11A shows that the top broad heat sink 10 can have a lead edge that can be inserted into slots at the top edge of the back wall 21 of the frame pan 18 in insertion direction 74, which can be at an acute angle with the base of the frame pan 18. FIG. 11B shows that once the lead edge is inserted into the slots, the top broad heat sink 10 can swing in downward motion 75 until the pocket or central depression 11 of the top broad heat sink 10 contacts the thermal pad joint 27 or the main integrated circuit or heat generating component of the main printed circuit board 13. The main printed circuit board 13 is omitted in FIG. 11 to more clearly show relationship of the top broad heat sink 10 with the frame pan 18; however, the frame pan 18 would have the main printed circuit board 13 therein in the actual application of the invention. Optionally, the frame pan 18 can have a central thermal contact protrusion 73 on the base 22 which can thermally contact the bottom portion of the main integrated circuit or heat generating component of the main printed circuit board 13 or the main printed circuit board 13 itself. Furthermore, the base portion 22 can have a series of apertures as shown to provide additional heat dissipation from the main printed circuit board 13.

Figure 11C:
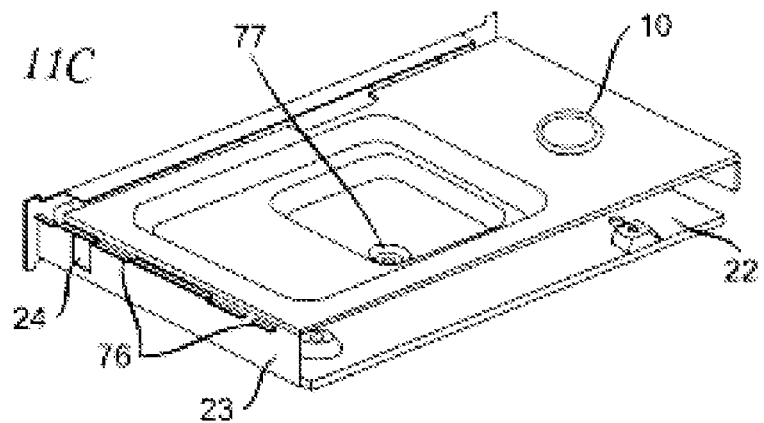

FIG. 11C further shows that the top broad heat sink 10, which can be aluminum, can have tabs 76 that fit into tab receiving slots in the side walls 23 to properly locate and/or secure the top broad heat sink 10 with the frame pan 18, which can be steel. Also, shown in FIG. 11C is that the top broad heat sink 10 can have a center boss 77 to promote thermal contact with the main printed circuit board 13 and/or components thereon. This contact can be secured with a screw or the like. It can be appreciated that the pocket or central depression 11 can actually have one or more levels of depressions.

In a presently preferred embodiment, the set top box has no vents or minimal vents, reduced size, and is adapted to be ergonomically assembled and disassembled. The disclosed product preferably has no fans and has a design that makes the product capable of being unusually compact. The set top box can be just large enough to fit the connectors along its back, the buttons along its front and the internal components. This is achieved by housing the pc board and the hot components in an all encompassing outer cover as disclosed. Additionally, the top and bottom parts of the inner shell assembly which are the top broad heat sink 10 and the base 22 of the frame pan 18 conduct the heat from hot components therein and spread out the heat. Then the parts of the shell radiate the heat to the inner surface of the outer cover 28. The outer cover 28 radiates and convects the heat to the ambient air. To optimize the radiation, the outer cover can have a flat black finish.

The set top box 1 according to the invention can have an external ac to dc power supply that can closely fit to the main pc board 13. With this design, the set top can effectively dissipate the heat.

It should be understood that although examples of the claimed inventions specifically mention set-top boxes and circuit boards, the invention is not limited to these features. For example, the invention is applicable to computers and other electronic devices having heat generating components. Furthermore, the invention is also applicable to electronic parts other than circuit boards which can generate heat.

The invention claimed is:

1. A set top box comprising:
    a top heat sink component having a planar peripheral portion surrounding a central depression portion on all four sides thereof;
    a circuit board under the top heat sink component, the circuit board having a heat generating component thermally contacting the central depression portion;
    a frame having two side walls, a back wall, a base and embosses, the base being under the circuit board and the embosses contacting and supporting the circuit board; and
    an outer cover housing an internal assembly which contains the top heat sink component, circuit board, and frame therein, said planar peripheral portion of the top heat sink being spaced from the outer cover when the set top box is assembled;
    wherein the outer cover has an upper wall, a lower wall, two outer side walls, a front side and an open end, wherein the open end is configured to enable the internal assembly to be inserted into the outer cover, wherein the two side walls of the frame are parallel to the two outer side walls of the outer cover and the back wall being positioned at the open end of the outer cover, and wherein at least one of the parallel side walls has a slot and the outer cover has a clip snap adjacent to at least one of the outer side walls, the clip snap is engaged in the slot and locks the internal assembly within the outer cover.

2. The set top box of claim 1, wherein the clip snap is adjacent to the open end and the clip snap has a flexible member directed away from the open end and forming an acute angle with the at least one outer side wall and the clip snap also has a distal end that engages in the slot.

3. The set top box of claim 2, wherein the clip snap has a top portion and bottom portion engaged with an edge region of the upper wall and the lower wall, respectively, thereby securing the clip snap within the outer cover.

4. The set top box of claim 3, wherein the back wall has an opening aligned with the flexible member and adapted to receive a release rod such that the insertion of the release rod causes the distal end to disengage from the slot, thereby permitting the internal assembly to be removed.

5. A set top box comprising:
    a top heat sink component having a planar peripheral portion surrounding a central depression portion on all four sides thereof;
    a circuit board under the top heat sink component, the circuit board having a heat generating component thermally contacting the central depression portion;
    a frame having two side walls, a back wall, a base and embosses, the base being under the circuit board and the embosses contacting and supporting the circuit board; and
    an outer cover housing an internal assembly which contains the top heat sink component, circuit board, and frame therein, said planar peripheral portion of the top heat sink being spaced from the outer cover when the set top box is assembled, wherein: the frame has two parallel side walls and a back wall, the side walls being parallel to two outer side walls of the outer covers and the back wall being positioned at the open end of the outer cover; and a gap is between an entire edge of the planar peripheral portion and the side walls and the back wall.

6. The set top box of claim 5, wherein: an upper gap is between an upper wall of the outer cover and the planar peripheral portion of the top broad heat sink component.

7. The set top box of claim 6, wherein: a bottom gap is between a lower wall of the outer cover and the base of the frame.

8. The set top box of claim 7, wherein the base has apertures.

9. The set top box of claim 7, comprising a plurality of feet attached to an exterior side of the lower wall, wherein the feet are at least 6 mm in height.

10. A set top box comprising:
    a top heat sink component having a planar peripheral portion surrounding a central depression portion on all four sides thereof;
    a circuit board under the top heat sink component, the circuit board having a heat generating component thermally contacting the central depression portion;
    a frame having two side walls, a back wall, a base and embosses, the base being under the circuit board and the embosses contacting and supporting the circuit board; and
    an outer cover housing an internal assembly which contains the top heat sink component, circuit board, and frame therein, said planar peripheral portion of the top heat sink being spaced from the outer cover when the set top box is assembled wherein: the frame has two parallel side walls and a back wall, the side walls being parallel to two outer side walls of the outer covers and the back wall being positioned at the open end of the outer cover; and the planar peripheral portion has a thermal joint between a border of the planar periphery portion and the side walls and the back wall.

11. A set top box comprising:
    a top heat sink component having a planar peripheral portion surrounding a central depression portion;
    a circuit board under the top heat sink component, the circuit board having a heat generating component thermally contacting the central depression portion;
    a frame having two side walls, a back wall, a base, embosses and at least one slot in one of the two side walls and at least one opening in the back wall, the base being under the circuit board and the embosses contacting and supporting the circuit board;
    an outer cover housing an internal assembly which comprises the top heat sink component, circuit board, and frame therein, the outer cover having an upper wall, a lower wall, two outer side walls, a front side, an open end and a clip snap adjacent to at least one of the outer side walls;
    wherein the at least one opening in the back wall is aligned with a flexible member of the clip snap and is adapted to receive a release rod such that the insertion of the release rod causes a distal end of the clip snap to disengage from an engaged slot, thereby permitting the internal assembly to be removed from the outer cover housing.

* * * * *